United States Patent
Gong

(10) Patent No.: US 12,232,344 B2
(45) Date of Patent: Feb. 18, 2025

(54) ELECTROLUMINESCENT DEVICE INCLUDING QUANTUM DOT LIGHT EMITTING DIODE (QLED) AND MANUFACTURING METHOD THEREOF

(71) Applicants: HUIZHOU CHINA STAR OPTOELECTRONICS DISPLAY CO., LTD., Huizhou (CN); TCL CHINA STAR OPTOELECTRONICS TECHNOLOGY CO., LTD., Shenzhen (CN)

(72) Inventor: Jinhui Gong, Huizhou (CN)

(73) Assignees: HUIZHOU CHINA STAR OPTOELECTRONICS DISPLAY CO., LTD., Huizhou (CN); TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/621,201

(22) PCT Filed: Nov. 8, 2021

(86) PCT No.: PCT/CN2021/129294
§ 371 (c)(1),
(2) Date: Dec. 20, 2021

(87) PCT Pub. No.: WO2023/070737
PCT Pub. Date: May 4, 2023

(65) Prior Publication Data
US 2024/0032318 A1      Jan. 25, 2024

(30) Foreign Application Priority Data
Oct. 29, 2021   (CN) .......................... 202111269155.1

(51) Int. Cl.
H10K 50/115      (2023.01)
H10K 50/15       (2023.01)
(Continued)

(52) U.S. Cl.
CPC .......... *H10K 50/115* (2023.02); *H10K 71/12* (2023.02); *H10K 50/15* (2023.02); *H10K 50/16* (2023.02)

(58) Field of Classification Search
CPC ...... H10K 50/115; H10K 71/12; H10K 50/16; H10K 50/15
(Continued)

(56) References Cited

U.S. PATENT DOCUMENTS

| 10,615,358 B1 | 4/2020 | Palles-Dimmock |
| 2010/0032645 A1* | 2/2010 | Choi .................. H05B 33/10 |
| | | 257/E51.027 |

(Continued)

FOREIGN PATENT DOCUMENTS

| CN | 101079471 A | 11/2007 |
| CN | 102456839 A | 5/2012 |

(Continued)

*Primary Examiner* — Didarul A Mazumder
(74) *Attorney, Agent, or Firm* — The Roy Gross Law Firm, LLC; Roy Gross

(57) ABSTRACT

An electroluminescent device and a manufacturing method therefor are provided. The electroluminescent device includes an anode, a hole function layer, a quantum dot emission layer, an electron function layer, and a cathode that are sequentially stacked. The quantum dot emission layer is doped with a carrier transport material. The carrier transport material doped in the quantum dot emission layer not only can improve the conductivity of the quantum dot light emitting material and facilitate the injection and the transport of carriers, but also can increase the recombination probability of the carriers.

8 Claims, 2 Drawing Sheets

(51) Int. Cl.
*H10K 50/16* (2023.01)
*H10K 71/12* (2023.01)

(58) Field of Classification Search
USPC ........................................ 257/40; 438/82, 99
See application file for complete search history.

(56) References Cited

U.S. PATENT DOCUMENTS

| | | | |
|---|---|---|---|
| 2019/0386233 A1* | 12/2019 | Wu ........................ | H10K 50/11 |
| 2020/0127218 A1 | 4/2020 | Palles-Dimmock | |
| 2020/0168826 A1* | 5/2020 | You ........................ | H10K 71/00 |
| 2020/0411719 A1* | 12/2020 | Kimoto ........... | H01L 31/035218 |
| 2021/0119160 A1* | 4/2021 | Umeda ................. | H10K 50/15 |
| 2022/0158107 A1* | 5/2022 | Angioni ................. | H10K 50/17 |

FOREIGN PATENT DOCUMENTS

| | | |
|---|---|---|
| CN | 102651451 A | 8/2012 |
| CN | 107833976 A | 3/2018 |

\* cited by examiner

ELECTROLUMINESCENT DEVICE INCLUDING QUANTUM DOT LIGHT EMITTING DIODE (QLED) AND MANUFACTURING METHOD THEREOF

CROSS REFERENCE TO RELATED APPLICATIONS

This application is a National Phase of PCT Patent Application No. PCT/CN2021/129294 having International filing date of Nov. 8, 2021, which claims the benefit of priority of Chinese Application No. 202111269155.1 filed on Oct. 29, 2021. The contents of the above applications are all incorporated by reference as if fully set forth herein in their entirety.

FIELD OF INVENTION

The present invention relates to the field of display technologies, and in particular, to an electroluminescent device and a manufacturing method therefor.

BACKGROUND OF INVENTION

The quantum dot light emitting material has excellent photoelectric properties, such as adjustable light emitting wavelengths, high quantum efficiency, and high color purity. Therefore, the quantum dot light emitting diode (QLED) has broad application prospects in the field of optoelectronic displays. However, due to the insulating properties of the organic long-chain ligands on the surface of the quantum dots, a series of problems may be caused, which are as follows in detail. Ligands on the surface of quantum dots may hinder the transport of carriers in the quantum dot light emitting film layer and increase the injection barrier of the device. The carriers accumulate at the interface between the electron function layer and the quantum dot light emitting film layer and at the interface between the hole function layer and the quantum dot light emitting film layer, resulting in quenching, and reducing the luminous efficiency.

The methods commonly used for improving the conductivity of quantum dots in the prior art include the ligand washing method and the complex conduction method, both of which have some problems. In the ligand washing method, it is difficult to control the number of retained ligands, excessively many retained ligands result in poor results, and excessively few retained ligands result in poor stability of the quantum dots. In the complex conduction method, there are few suitable complexes, and the synthesis process is complicated.

Based on the above, the conductivity of the conventional quantum dot light emitting film layer requires to be improved.

SUMMARY OF INVENTION

Technical Problem

Embodiments of the present invention provide an electroluminescent device to resolve the technical problem that in the conventional electroluminescent device, carriers accumulate at the interface between the electron function layer and the quantum dot light emitting film layer and at the interface between the hole function layer and the quantum dot light emitting film layer, resulting in quenching, and reducing the luminous efficiency of the quantum dot light emitting diode (QLED).

Technical Solution

To resolve the problem described above, the technical solutions provided by the present invention are as follows:

An embodiment of the present invention provides an electroluminescent device, including: an anode, a hole function layer, a quantum dot emission layer, an electron function layer, and a cathode that are sequentially stacked, wherein the quantum dot emission layer is doped with a carrier transport material, the carrier transport material includes at least one of a hole transport material or an electron transport material, the quantum dot emission layer includes a quantum dot light emitting material, and a mass ratio of the carrier transport material to the quantum dot light emitting material is in a range of 0.1% to 2%.

In some embodiments of the present invention, the carrier transport material includes the hole transport material and the electron transport material, and a doping mass ratio of the hole transport material to the electron transport material is in a range of 0.1-10.

In some embodiments of the present invention, the carrier transport material includes the hole transport material and the electron transport material, the quantum dot emission layer includes the quantum dot light emitting material, and a p-i-n heterojunction is formed by the quantum dot light emitting material, the hole transport material, and the electron transport material.

In some embodiments of the present invention, the quantum dot emission layer includes the quantum dot light emitting material, and a band offset formed by a conduction band/valence band of the carrier transport material and a conduction band/valence band of the quantum dot light emitting material is in a range of 0.1-0.5 eV.

In some embodiments of the present invention, the hole function layer includes a hole injection layer, the electron function layer includes an electron injection layer, the hole injection layer is in direct contact with one side surface of the quantum dot emission layer, and the electron injection layer is in direct contact with another side surface of the quantum dot emission layer.

In some embodiments of the present invention, the hole function layer includes a hole injection layer and a hole transport layer that are stacked, the electron function layer includes an electron transport layer and an electron injection layer that are stacked, the hole transport layer is in direct contact with one side surface of the quantum dot emission layer, and the electron transport layer is in direct contact with another side surface of the quantum dot emission layer.

In some embodiments of the present invention, the carrier transport material includes at least one of 4,4'-(bis(9-carbazolyl))biphenyl (CBP), Poly(9,9-dioctylfluorene-co-N-(4-butylphenyl)diphenylamine) (TFB), Poly (N,N'-bis-4-butylphenyl-N,N'-bisphenyl)benzidine (Poly-TBD), Poly (9,9-di-n-octylfluorenyl-2,7-diyl) (PFO), 1,3,5-Tris (1-phenyl-1H-benzimidazol-2-yl)benzene (TPBi), 4,7-Diphenyl-1,10-phenanthroline (Bphen), or 4,6-Bis(3,5-di(pyridin-3-yl)phenyl)-2-methylpyrimidine (B3PYMPM).

In some embodiments of the present invention, the hole transport material includes at least one of the CBP, the TFB, the Poly-TBD, or the PFO, and the electron transport material includes at least one of the TPBi, the Bphen, or the B3PYMPM.

An embodiment of the present invention further provides another electroluminescent device, including:

an anode, a hole function layer, a quantum dot emission layer, an electron function layer, and a cathode that are sequentially stacked, wherein the quantum dot emission layer is doped with a carrier transport material.

In some embodiments of the present invention, the quantum dot emission layer includes a quantum dot light emitting material, and a mass ratio of the carrier transport material to the quantum dot light emitting material is in a range of 0.1% to 2%.

In some embodiments of the present invention, the carrier transport material includes at least one of a hole transport material or an electron transport material.

In some embodiments of the present invention, the carrier transport material includes the hole transport material and the electron transport material, and a doping mass ratio of the hole transport material to the electron transport material is in a range of 0.1-10.

In some embodiments of the present invention, the carrier transport material includes the hole transport material and the electron transport material, the quantum dot emission layer includes the quantum dot light emitting material, and a p-i-n heterojunction is formed between the quantum dot light emitting material and the carrier transport material.

In some embodiments of the present invention, the quantum dot emission layer includes the quantum dot light emitting material, and a band offset formed by a conduction band/valence band of the carrier transport material and a conduction band/valence band of the quantum dot light emitting material is in a range of 0.1-0.5 eV.

In some embodiments of the present invention, the hole function layer includes a hole injection layer, the electron function layer includes an electron injection layer, the hole injection layer is in direct contact with one side surface of the quantum dot emission layer, and the electron injection layer is in direct contact with another side surface of the quantum dot emission layer.

In some embodiments of the present invention, the hole function layer includes a hole injection layer and a hole transport layer that are stacked, the electron function layer includes an electron transport layer and an electron injection layer that are stacked, the hole transport layer is in direct contact with one side surface of the quantum dot emission layer, and the electron transport layer is in direct contact with another side surface of the quantum dot emission layer.

In some embodiments of the present invention, the carrier transport material includes at least one of CBP, TFB, Poly-TBD, PFO, TPBi, Bphen, or B3PYMPM.

In some embodiments of the present invention, the carrier transport material includes a hole transport material, and the hole transport material includes at least one of the CBP, the TFB, the Poly-TBD, or the PFO.

In some embodiments of the present invention, the carrier transport material includes an electron transport material, and the electron transport material includes at least one of the TPBi, the Bphen, or the B3PYMPM. An embodiment of the present invention further provides a method for manufacturing an electroluminescent device in the above embodiment, including:

S10: dispersing a carrier transport material in a first organic solvent, and uniformly mixing the first organic solvent to form a first solution;

S20: dissolving a quantum dot light emitting material in a second organic solvent, and uniformly mixing the second organic solvent to form a second solution;

S30: mixing the first solution with the second solution to form a mixed solution;

S40: coating the mixed solution on a substrate provided with an anode and a hole function layer to form a quantum dot emission layer; and S50: successively manufacturing an electron function layer and a cathode on the quantum dot emission layer.

Beneficial Effects

The embodiments of the present invention provide the electroluminescent device and the manufacturing method therefor. The electroluminescent device includes the anode, the hole function layer, the quantum dot emission layer, the electron function layer, and the cathode that are sequentially stacked. The quantum dot emission layer is doped with the carrier transport material. On one hand, the carrier transport material can improve the conductivity of quantum dot light emitting material and facilitate the injection and the transport of carriers. On the other hand, p-type and n-type transport materials are mixed with the quantum dot light emitting material to form tiny pin-type heterojunctions. Therefore, the recombination probability of the carriers can be increased, and the luminous quantum efficiency of the electroluminescent device can be improved.

DETAILED DESCRIPTION OF PREFERRED EMBODIMENTS

The following clearly and completely describes technical solutions in embodiments of the present disclosure with reference to the accompanying drawings in the embodiments of the present disclosure. Apparently, the described embodiments are only some embodiments rather than all the embodiments of the present disclosure. All other embodiments obtained by a person skilled in the art based on the embodiments of the present disclosure without creative efforts shall fall within the protection scope of the present disclosure.

In the description of the present disclosure, it is to be understood that terms "first" and "second" are used merely for the purpose of description, and shall not be construed as indicating or implying relative importance or implying a quantity of indicated technical features. To simplify the disclosure of the present disclosure, components and settings in particular examples are described below. Certainly, they are merely examples and are not intended to limit the present disclosure. The present disclosure provides examples of various particular processes and materials, but a person of ordinary skill in the art may be aware of application of another process and/or use of another material.

For a conventional electroluminescent device in the present invention, since there is a technical problem that carriers accumulate at an interface between an electron function layer and a quantum dot emission layer and at an interface between a hole function layer and the quantum dot emission layer, resulting in quenching and reducing the luminous efficiency of the electroluminescent device, the present embodiment is provided to overcome the defect.

Figure 1:
FIG. 1 is a schematic diagram of stacked film layers of an electroluminescent device according to an embodiment of the present invention.

Referring to FIG. 1, an embodiment of the present invention provides an electroluminescent device 100. The electroluminescent device 100 includes an anode 20, a hole function layer 30, a quantum dot emission layer 40, an electron function layer 50, and a cathode that are stacked on a side. The electroluminescent device 100 may be a top-emitting device, or may be a bottom-emitting device. The anode 20 is disposed on a substrate 10. The hole function layer 30 is disposed on the anode 20. The quantum dot emission layer 40 is disposed on the hole function layer 30. The electron function layer 50 is disposed on the quantum dot emission layer 40. The cathode 60 is disposed on the electron function layer 50.

In the embodiment of the present invention, the substrate 10 may be a glass substrate, the anode 20 may be a transparent indium tin oxide (ITO) electrode, and the cathode 60 may be an aluminum electrode.

In the prior art, the insulating properties of the organic long-chain ligands on the surface of the quantum dot emission layer 40 may cause carriers (holes, electrons) to accumulate at the interface between the quantum dot emission layer 40 and the hole function layer 30 and at the interface between the quantum dot emission layer 40 and the electron function layer 50, resulting in quenching. In the embodiment of the present invention, the quantum dot emission layer 40 is doped with a carrier transport material, which can change the electrical conductivity of the quantum dot emission layer 40, but does not change the light emitting characteristics of the quantum dot emission layer 40. In this way, a quantity of diffusion channels of the carriers can be increased, the diffusion of the carriers in the quantum dot emission layer 40 can be facilitated, and the quenching caused by the accumulation of the carriers at the above interfaces can be effectively reduced. The "doping" mentioned in the embodiment of the present invention refers to mixing another material into a certain film material, and the mixed material does not change the crystal structure of the original film material. Therefore, the carrier transport material that is doped in the embodiment of the present invention will not enter the crystal structure of the quantum dot light emitting material of the quantum dot emission layer 40.

The carrier transport material includes at least one of a hole transport material or an electron transport material. In the embodiment of the present invention, the carrier transport material includes both the hole transport material and the electron transport material. The hole transport material may be a P-type organic transport material, and the electron transport material may be an N-type organic transport material. The P-type organic transport material is good for transporting holes, and the N-type organic transport material is good for transporting electrons. The holes are transported to the quantum dot light emitting material or the hole transport material in the quantum dot emission layer 40 through the hole function layer 30. The electrons are transported to the quantum dot light emitting material or the electron transport material in the quantum dot emission layer 40 through the electron function layer 50. In this way, the quantity of diffusion channels of the carriers in the quantum dot emission layer 40 can be increased.

In the quantum dot emission layer 40, since a contact area between the carrier transport material and the quantum dot light emitting material is increased, a pin heterojunction is formed between the quantum dot light emitting material and the hole transport material and the electron transport material. In this way, countless tiny pin heterojunctions can effectively increase the recombination probability of the holes and electrons in the quantum dot emission layer 40, thereby improving the quantum dot efficiency of the electroluminescent device.

In detail, a mass ratio of the carrier transport material to the quantum dot light emitting material is in a range of 0.1% to 2%. Within this range, the luminous efficiency of quantum dots can be effectively improved. The doped carrier transport material should not be too much, otherwise the quantum dot emission layer 40 that is a semiconductor itself may be changed to a conductive film layer. This may cause the electroluminescent device to be incapable of emitting light.

Further, when the carrier transport material includes both the hole transport material and the electron transport material, and a doping mass ratio of the hole transport material to the electron transport material is in a range of 0.1-10. In this way, the injection and the transport of the holes and electrons in the quantum dot emission layer 40 can be effectively improved.

On the one hand, the selection of the carrier transport material is mainly to meet the transport capacity of the carriers to effectively transport the carriers. On the other hand, the carrier transport material can be selected according to a band offset formed by a conduction band/valence band of the carrier transport material and a conduction band/valence band of the quantum dot light emitting material. The band offset formed by the conduction band/valence band of the carrier transport material and the conduction band/valence band of the quantum dot light emitting material is in a range of 0.1-0.5 eV. This facilitates the recombination of the holes and electrons in the quantum dot emission layer 40.

The carrier transport material includes at least one of 4,4'-(bis(9-carbazolyl))biphenyl (CBP), Poly(9,9-dioctylfluorene-co-N-(4-butylphenyl)diphenylamine) (TFB), Poly (N,N'-bis-4-butylphenyl-N,N'-bisphenyl)benzidine (Poly-TBD), Poly (9,9-di-n-octylfluorenyl-2,7-diyl) (PFO), 1,3,5-Tris (1-phenyl-1H-benzimidazol-2-yl)benzene (TPBi), 4,7-Diphenyl-1,10-phenanthroline (Bphen), or 4,6-Bis(3,5-di(pyridin-3-yl)phenyl)-2-methylpyrimidine (B3PYMPM). The CBP, the TFB, the Poly-TBD, and the PFO may be used as hole transport materials, and the TPBi, the Bphen, and the B3PYMPM may be used as electron transport materials. In the embodiment of the present invention, the quantum dot emission layer 40 is doped with both the hole transport material and the electron transport material. The doped hole transport material may be the CBP, and the doped electron transport material may be the TPBi.

In the embodiment of the present invention, the hole function layer 30 includes a hole injection layer, the electron function layer 50 includes an electron injection layer, the hole injection layer is in direct contact with one side surface of the quantum dot emission layer 40, and the electron injection layer is in direct contact with another side surface of the quantum dot emission layer 40.

In the embodiment of the present invention, the hole injection layer may be a PEDOT:PSS material, and the electron injection layer may be a ZnO material.

In other embodiments, the hole function layer 30 further includes a hole transport layer, and the electron function layer 50 further includes an electron transport layer, to improve the transport ability of the carriers before reaching the quantum dot emission layer 40. In detail, the hole function layer 30 includes a hole injection layer and a hole transport layer that are stacked. The electron function layer 50 includes an electron transport layer and an electron injection layer that are stacked. The hole transport layer is in direct contact with one side surface of the quantum dot emission layer 40. The electron transport layer is in direct contact with another side surface of the quantum dot emission layer 40.

Figure 2:
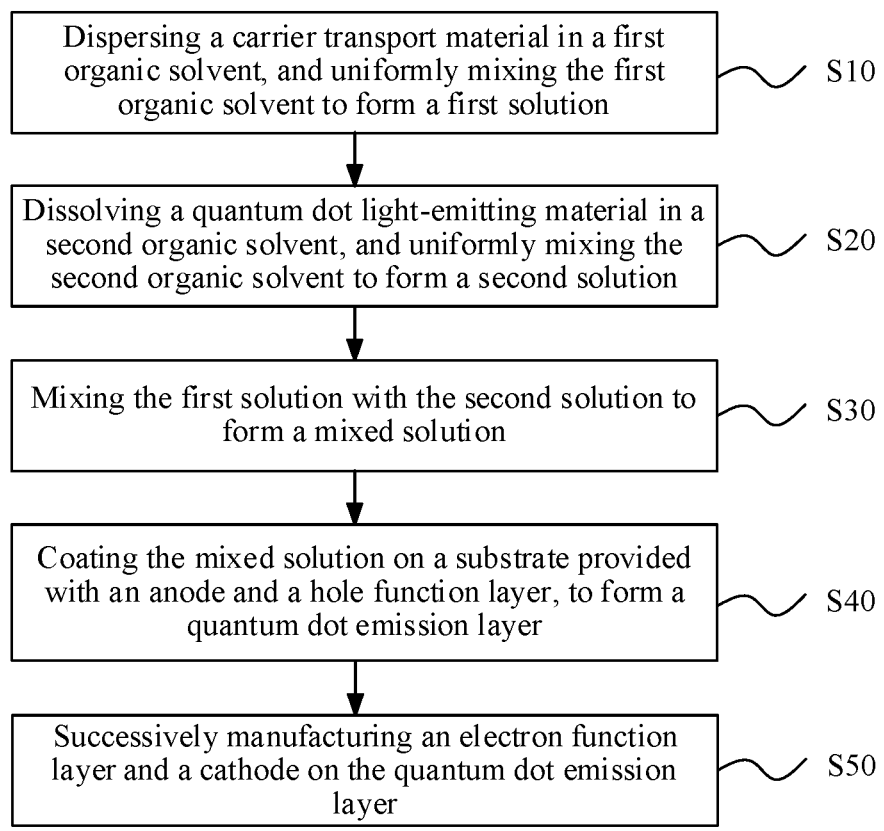
FIG. 2 is a schematic flowchart of a method for manufacturing an electroluminescent device according to an embodiment of the present invention.

Referring to FIG. 2, an embodiment of the present invention further provides a method for manufacturing the electroluminescent device 100 in the above embodiment. The method includes steps as follows. S10: Dispersing a carrier transport material in a first organic solvent, and uniformly mixing the first organic solvent to form a first solution. S20: Dissolving a quantum dot light emitting material in a second organic solvent, and uniformly mixing the second organic solvent to form a second solution. S30: Mixing the first solution with the second solution to form a mixed solution. S40: Coating the mixed solution on a substrate 10 provided with an anode 20 and a hole function layer 30 to form a quantum dot emission layer 40.

In detail, the CBP and the TPBi materials may be selected as the carrier transport materials, and the CBP and the TPBi are simultaneously dispersed in the first organic solvent. In this way, the carrier transport materials can be fully dissolved and uniformly mixed by means of ultrasonic vibration.

The first organic solvent may be a non-polar solvent, and includes at least one of hexane, heptane, octane, nonane, decane, or cyclohexane. A mass fraction of the carrier transport material in the first solution is in a range of 0.1% to 5%, and within this range, the carrier transport material has desirable solubility.

In the embodiment of the present invention, a same material is selected as the materials of the second organic solvent and the first organic solvent, so as to increase the uniformity of mixing the first solution with the second solution.

When the first solution and the second solution are mixed, ultrasonic vibration is also performed to fully diffuse the solute in the solution, and then the mixed solution is filtered using a 0.45 um PET filter to remove large particles. The first solution and the second solution are mixed in different proportions. During the mixing, it is necessary to ensure that the mass ratio of the carrier transport material to the quantum dot light emitting material in the two solutions is in a range of 0.1%-2%.

On the substrate 10 provided with the anode 20 and the hole injection layer (and the hole transport layer), the mixed solution is sequentially spin-coated or vapor-deposited, and then a process, such as baking is performed to form the quantum dot emission layer 40. The first solvent and the second solvent will volatilize during the formation of the quantum dot emission layer 40, not affecting the luminous efficiency of the quantum dot emission layer 40.

Then the electron function layer 50 and the cathode 60 are successively provided on the quantum dot emission layer 40. The electron function layer 50 includes an electron injection layer. In other embodiments, the electron function layer 50 may further include the electron transport layer formed on the electron injection layer.

Based on the above, the embodiments of the present invention provide an electroluminescent device and a manufacturing method therefor. The electroluminescent device includes an anode 20, a hole function layer 30, a quantum dot emission layer 40, an electron function layer 50, and a cathode 60 that are sequentially stacked. The quantum dot emission layer 40 is doped with a carrier transport material. On the one hand, the carrier transport material can improve the conductivity of quantum dot light emitting material and facilitate the injection and the transport of carriers. On the other hand, p-type and n-type transport materials are mixed with the quantum dot light emitting material to form tiny pin-type heterojunctions. Therefore, the recombination probability of the carriers can be increased, and the luminous quantum efficiency of the electroluminescent device can be improved.

In the foregoing embodiments, the descriptions of the embodiments have different focuses. For a part that is not detailed in an embodiment, reference may be made to the relevant description of other embodiments.

The electroluminescent device and the manufacturing method therefor in the embodiments of the present invention are described in detail above. The principle and implementations of the present invention are described herein through specific examples. The description about the embodiments of the present invention is merely provided to help understand the technical solutions and core ideas of the present invention. It should be appreciated by a person skilled in the art that, modifications may still be made to the technical solutions described in the foregoing embodiments, or equivalent replacements may be made to the part of the technical features; and these modifications or replacements will not cause the essence of corresponding technical solutions to depart from the scope of the technical solutions in the embodiments of the present invention.

What is claimed is:

1. An electroluminescent device, comprising:
   an anode, a hole function layer, a quantum dot emission layer, an electron function layer, and a cathode that are sequentially stacked, wherein
   the quantum dot emission layer is doped with a carrier transport material, the carrier transport material comprises at least one of a hole transport material or an electron transport material,
   the quantum dot emission layer comprises a quantum dot light emitting material, and a mass ratio of the carrier transport material to the quantum dot light emitting material is in a range of 0.1% to 2%;
   the carrier transport material comprises a hole transport material and an electron transport material, and a doping mass ratio of the hole transport material to the electron transport material is in a range of 0.1-10.

2. The electroluminescent device as claimed in claim 1, wherein a p-i-n heterojunction is formed by the quantum dot light emitting material, the hole transport material, and the electron transport material.

3. The electroluminescent device as claimed in claim 1, wherein a band offset formed by a conduction band/valence band of the carrier transport material and a conduction band/valence band of the quantum dot light emitting material is in a range of 0.1-0.5 eV.

4. The electroluminescent device as claimed in claim 1, wherein the hole function layer comprises a hole injection layer, the electron function layer comprises an electron injection layer, the hole injection layer is in direct contact with one side surface of the quantum dot emission layer, and the electron injection layer is in direct contact with another side surface of the quantum dot emission layer.

5. The electroluminescent device as claimed in claim 1, wherein the hole function layer comprises a hole injection layer and a hole transport layer that are stacked, the electron function layer comprises an electron transport layer and an electron injection layer that are stacked, the hole transport layer is in direct contact with one side surface of the quantum dot emission layer, and the electron transport layer is in direct contact with another side surface of the quantum dot emission layer.

6. The electroluminescent device as claimed in claim 1, wherein the carrier transport material comprises at least one of 4,4'-(bis(9-carbazolyl))biphenyl (CBP), Poly(9,9-dioctylfluorene-co-N-(4-butylphenyl)diphenylamine) (TFB), Poly(N,N'-bis-4-butylphenyl-N,N'-bisphenyl)benzidine (Poly-TBD), Poly(9,9-di-n-octylfluorenyl-2,7-diyl) (PFO), 1,3,5-Tris(1-phenyl-1H-benzimidazol-2-yl)benzene (TPBi), 4,7-Diphenyl-1,10-phenanthroline (Bphen), or 4,6-Bis(3,5-di(pyridin-3-yl)phenyl)-2-methylpyrimidine (B3PYMPM).

7. The electroluminescent device as claimed in claim 6, wherein the hole transport material comprises at least one of the CBP, the TFB, the Poly-TBD, or the PFO, and the electron transport material comprises at least one of the TPBi, the Bphen, or the B3PYMPM.

8. A method for manufacturing an electroluminescent device, comprising:
   S10: dispersing a carrier transport material in a first organic solvent, and uniformly mixing the first organic solvent to form a first solution, wherein the carrier transport material comprises a hole transport material and an electron transport material, and a doping mass ratio of the hole transport material to the electron transport material is in a range of 0.1-10;
   S20: dissolving a quantum dot light emitting material in a second organic solvent, and uniformly mixing the second organic solvent to form a second solution, a mass ratio of the carrier transport material to the quantum dot light emitting material is in a range of 0.1% to 2%;
   S30: mixing the first solution with the second solution to form a mixed solution;
   S40: coating the mixed solution on a substrate provided with an anode and a hole function layer to form a quantum dot emission layer; and
   S50: successively manufacturing an electron function layer and a cathode on the quantum dot emission layer.

* * * * *